United States Patent [19]

Kawabata

[11] Patent Number: 5,100,478
[45] Date of Patent: Mar. 31, 1992

[54] SOLAR CELL

[75] Inventor: Kiyoshi Kawabata, Itami, Japan

[73] Assignee: Mitsubishi Denki Kabushiki Kaisha, Japan

[21] Appl. No.: 618,415

[22] Filed: Nov. 27, 1990

[30] Foreign Application Priority Data

Dec. 1, 1989 [JP] Japan .................................. 1-314108

[51] Int. Cl.$^5$ ........................ H01L 31/06; H01L 31/18
[52] U.S. Cl. ..................................... 136/249; 136/255; 136/256; 136/259; 437/2; 437/4; 437/5; 357/15; 357/20; 357/30
[58] Field of Search .................. 136/249 TJ, 255, 256, 136/258 PC, 259; 437/2-5, 175; 357/15, 20, 30 J

[56] References Cited

U.S. PATENT DOCUMENTS

| 3,310,439 | 3/1967 | Seney | 136/259 |
| 4,239,553 | 12/1980 | Barnett et al. | 136/256 |
| 4,406,913 | 9/1983 | Weyrich | 136/259 |

OTHER PUBLICATIONS

Sinton et al., "An Optimization ... Solar Cells", 19th IEEE Photovoltaic Specialists Conference, 1987, pp. 1201-1208.
Reis et al., "Recrystallized Silicon ... Solar Cells", 19th IEEE Photovoltaic Specialists Conference, 1987, pp. 1405-1408.

Primary Examiner—Aaron Weisstuch
Attorney, Agent, or Firm—Leydig, Voit & Mayer

[57] ABSTRACT

A solar cell includes a semiconductor substrate having a plurality of recesses at one surface leaving a plurality of mutually isolated areas of the substrate exposed at that surface, an electrically insulating material filling the recesses, a semiconductor film disposed on the substrate and the electrically insulating material forming a plurality of mutually isolated rectifying junctions with the substrate, one electrode in electrical contact with the semiconductor film at a light incident surface of the solar cell and another electrode in electrical contact with the substrate. The solar cell is made by forming the plurality of recesses, depositing an electrically insulating material on the substrate and in the recesses, removing a portion of the electrically insulating material to expose the substrate at a plurality of mutually isolated locations, depositing the semiconductor film on the electrically insulating material and the substrate, and depositing the electrodes.

29 Claims, 10 Drawing Sheets

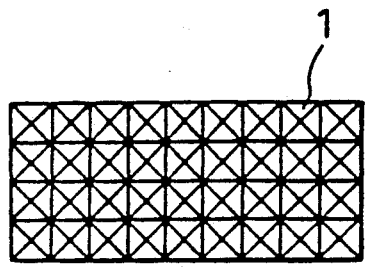
FIG. 3(a)
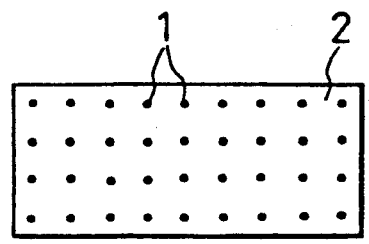
FIG. 3(b)
FIG. 4
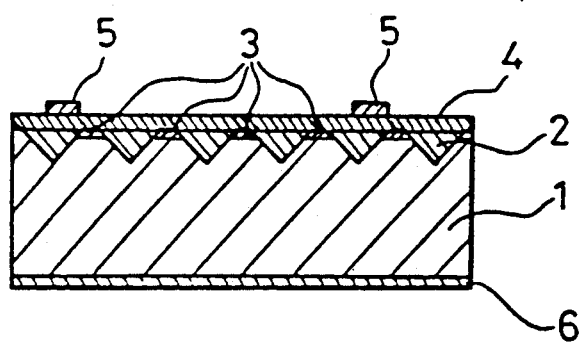

F I G. 10(b)
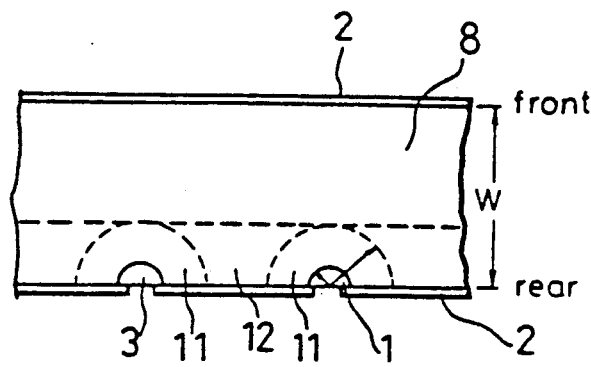
F I G. 10(c)
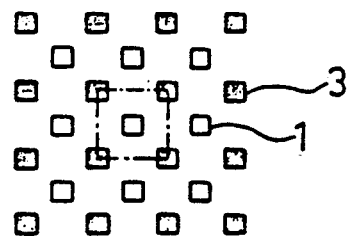
F I G. 10(d)
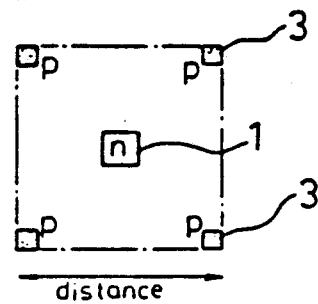

(PRIOR ART)

(PRIOR ART)

SOLAR CELL

FIELD OF THE INVENTION

The present invention relates to a solar cell including a member having a plurality of recesses filled with an electrically insulating material for forming a plurality of relatively small area, spaced apart rectifying junctions and/or for producing internal reflections of incident light for enhancing solar cell efficiency and to methods of manufacturing the solar cells.

BACKGROUND OF THE INVENTION

Solar cells including a plurality of relatively small area, spaced apart rectifying junctions are known. For example, a so-called point contact solar cell described by Sinton and Swanson at the IEEE 19th Photovoltaics Specialists Conference (1987) and in the Conference Record thereof at pages 1201–1208 is shown in a schematic perspective view in FIG. 10(a). FIG. 10(b) is a cross-sectional view illustrating the collection of photo-generated charge carriers in the point contact solar cell. FIGS. 10(c) and 10(d) are schematic views showing arrangements of p-type and n-type regions in the point contact solar cell. In these and the other figures, the same reference numbers indicate the same elements.

In FIG. 10(a), a relatively high resistance silicon substrate 8, i.e., a substrate that is relatively free of impurities, receives light, indicated by hv, at a front surface and has an array of spaced apart, relatively small area p-type and n-type regions at the opposite, rear surface of the substrate. The n-type regions 1 and the p-type regions 3 are disposed within an insulating film 2 at the rear surface of the substrate. The n-type regions 1 are interconnected through electrodes 6 and the p-type regions 3 are interconnected through electrodes 5. The electrodes 5 and 6 are both disposed at the rear surface. The point contact structure shown exploits the advantages of undoped silicon in which charge carrier recombination rates at the surface and within the bulk material are reduced. The reduced recombination rates produce relatively long diffusion lengths for the photo-generated charge carriers, improving the probability that those photo-generated carriers will reach and be collected at the relatively small area doped regions.

Each of the doped regions 1 and 3 collects charge carriers that reach respective collection regions 11 shown in FIG. 10(b) as spherical regions surrounding respective doped regions. As indicated in FIG. 10(b), these collection regions are not continuous so that charge carriers that travel between the collection regions 11, in "stagnant" regions 12, are not collected. The doped regions are arranged in an array, as illustrated in FIGS. 10(c) and 10(d), to reduce the number and size of the stagnant regions 12 between the collection regions 11. As shown in FIGS. 10(c) and 10(d), the doped regions may be arranged in a rectangular array. A typical distance between adjacent doped regions in a rectangular array is 50 microns.

The open circuit voltage, $V_{oc}$, of the point contact solar cell is predicted by the diode equation $$V_{oc} = kT/q \ \ln\,[(I_L/J_sS_s) + 1]$$

wherein $I_L$ is the light generated current, $J_S$ is the dark diode reverse saturation current density, $S_S$ is the junction area, and $kT/q$ is Boltzmann's constant multiplied by the temperature and divided by the electronic charge.

In the point contact solar cell, the open circuit voltage is increased, increasing efficiency, because the junction area $S_S$ is smaller than in other solar cell structures.

A method of manufacturing the point contact type solar cell is illustrated in FIGS. 11(a)–11(l). In those figures, a silicon substrate 8 is masked by a first photoresist layer 9 in which apertures are prepared. A dopant is diffused through the apertures into the substrate 8 to form n-type regions 1. After removal of the first mask, a second mask 9 is applied to the substrate and apertures are opened in that second mask at different locations from the n-type regions 1. A dopant producing p-type conductivity is diffused into the substrate through the apertures in the second mask. After removal of the second mask, the structure of FIG. 11(g) is produced.

As illustrated in FIG. 11(h), an electrically insulating film 2, such as an oxide film, is deposited on substrate 8. A third mask 9, for example, a photoresist, is deposited on the oxide film 2 and apertures are formed in that third mask opposite each of the n-type regions 1 and 3. The third mask 9 is employed as an etching mask and the oxide film opposite each of the doped regions is removed by etching through the apertures to provide electrical access to the doped regions. Finally, as illustrated in FIG. 11(l), the electrodes 5 and 6, respectively interconnecting p-type regions 3 and n-type regions 1, are deposited on those regions and on the adjacent portions of the oxide film 2. As shown in these figures, the fabrication of the point contact type semiconductor requires many steps. Photolithographic processing is required three times with increasingly stringent registration constraints. These requirements complicate the fabrication process.

SUMMARY OF THE INVENTION

The present invention is directed to exploiting the advantages of increased open circuit voltage and higher efficiency of the point contact solar cell in a structure that is inexpensively manufactured without the necessity of forming and registering masks or using any photolithographic processes.

According to one aspect of the invention, a solar cell comprises a semiconductor substrate of a first conductivity type having opposed first and second surfaces, a plurality of recesses in the substrate at the first surface, leaving a plurality of mutually isolated areas of the substrate exposed at the first surface, an electrically insulating material filling the recesses, a first semiconductor film of a second conductivity type opposite the first conductivity type disposed on the substrate and the electrically insulating material at the first surface forming a plurality of mutually isolated rectifying junctions with the substrate, a first electrode in electrical contact with the first semiconductor film at a light incident surface of the solar cell, and a second electrode disposed on the second surface of the substrate in electrical contact with the substrate.

According to another aspect of the invention, a solar cell comprises an electrically conducting semiconductor substrate having opposed first and second surfaces, a plurality of recesses in the substrate at the first surface, leaving a plurality of mutually isolated areas of the substrate exposed at the first surface, an electrically insulating material filling the recesses, a first semiconductor film of a first conductivity type disposed on the electrically insulating material and the semiconductor substrate at the first surface, a second semiconductor film of a second conductivity type opposite the first conductivity type disposed on the first semiconductor film and forming a rectifying junction with the first semiconductor film, a first electrode in electrical contact with the second semiconductor film at a light incident surface of the solar cell, and a second electrode disposed on the second surface of the substrate in electrical contact with the substrate.

Still another aspect of the invention includes a method of making a solar cell comprising forming a plurality of recesses in a surface of a semiconductor substrate of a first conductivity type, depositing an electrically insulating material on the substrate and in the recesses, removing a portion of the electrically insulating material to expose a first surface of the substrate at a plurality of mutually isolated locations, depositing a first semiconductor film of a second conductivity type opposite the first conductivity type on the electrically insulating material and the first surface of the substrate to form a plurality of rectifying junctions between the first semiconductor film and the substrate, and depositing first and second electrodes in electrical contact with the first semiconductor film and substrate, respectively.

A fourth aspect of the invention includes a method of making a solar cell comprising forming a plurality of recesses in a surface of an electrically conductive semiconductor substrate, depositing an electrically insulating material on the substrate and in the recesses, removing a portion of the electrically insulating material to expose a first surface of the substrate at a plurality of mutually isolated locations confined by the insulating material, depositing a first semiconductor film of a first conductivity type on the electrically insulating material and the first surface of the substrate in electrical contact with the substrate at the plurality of mutually isolated locations on the substrate, depositing a second semiconductor film of second conductivity type on the first semiconductor film to form a rectifying junction with the first semiconductor film, and depositing first and second electrodes in electrical contact with the second semiconductor film and substrate, respectively.

Other objects and advantages of the present invention will become apparent from the detailed description given hereinafter. It should be understood, however, that the detailed description and specific embodiments are given by way of illustration only, since various changes and modifications within the spirit and scope of the invention will become apparent to those of skill in the art from the detailed description.

BRIEF DESCRIPTION OF THE DRAWINGS

FIGS. 3(a) and 3(b) are plan views corresponding to the side views of FIGS. 2(b) and 2(d).

FIG. 4 is a sectional side view of a solar cell in accordance with another embodiment of the invention.

FIGS. 10(a)–10(d) illustrate the structure of a prior art point contact solar cell.

DETAILED DESCRIPTION OF PREFERRED EMBODIMENTS

Figure 1A:
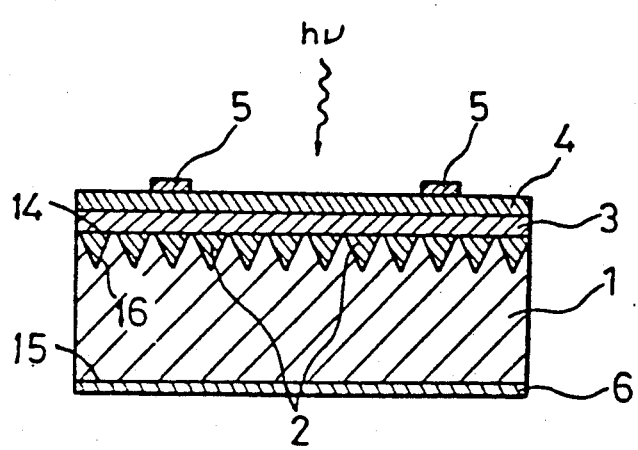
FIGS. 1(a) and 1(b) are sectional side views of a solar cell in accordance with an embodiment of the invention.
Figure 1B:
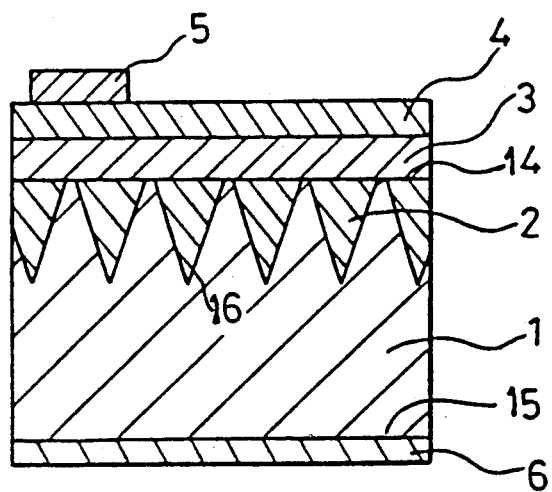

FIG. 1(a) is a cross-sectional view of a solar cell in accordance with an embodiment of the invention. FIG. 1(b) is an enlarged view of part of FIG. 1(a) illustrating important features of the invention. In these figures, an n-type semiconductor substrate 1, preferably silicon, includes a first surface 14 and an opposed second surface 15. The substrate 1 includes a plurality of recesses 16 extending into the substrate from the first surface 14. The recesses 16 are filled with an electrically insulating material 2, such as silicon dioxide, SiON, or silicon nitride. An important feature of the invention, more clearly shown in FIG. 1(b), is the exposure of relatively small areas of the substrate between the respective recesses 16 at the first surface 14.

A p-type semiconductor film 3 is disposed on the first surface 14 and forms a rectifying junction with substrate 1 where it is in contact with that substrate. In other words, a plurality of spaced apart rectifying junctions are formed between film 3 and substrate 1, the junctions being separated by the electrically insulating material 2 in the respective recesses 16. A transparent, anti-reflection film 4, which is preferably an electrically conducting film, such as indium tin oxide, tin oxide, or tantalum pentoxide, is disposed on film 3. As well known in the art, the thickness of that film 4 is adjusted depending on the wavelengths of the incident light and the dielectric constant of the film to reduce reflections of incident light, $h\sigma$.

Electrodes 5 are shown in FIG. 1(a) as disposed on the electrically conducting, transparent anti-reflection film 4. Those electrodes are in electrical contact with p-type film 3 through the electrically conducting antireflection film 4. A second electrode 6 is disposed on the second surface 15 of the solar cell.

Figure 2A:
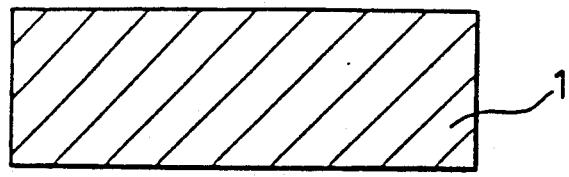
FIGS. 2(a)–(2f) are sectional side views illustrating steps in manufacturing a solar cell according to an embodiment of the invention.
Figure 2B:
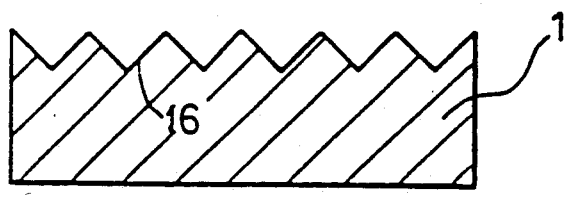

FIGS. 2(a)–2(f) are sectional side views illustrating a method of making the solar cell of FIG. 1(a). An n-type substrate 1 has a plurality of recesses formed in it, as illustrated in FIG. 2(b). When the substrate is single crystal silicon and has a (111) surface, the recesses can be formed by preferentially etching the substrate with potassium hydroxide. That etchant forms etch pits 16 that are inverted pyramids. These etch pits 16 are illustrated in FIG. 3(a), a plan view corresponding to the side view of FIG. 2(b). Typically, a silicon substrate 1 has an initial thickness of approximately 400 to 500 microns and the recesses, i.e., etch pits, have a depth of about 0.5 micron. The width of the pits, as shown in FIG. 2(b), is typically about 1 micron. When single crystal semiconductor materials other than silicon, particularly compound semiconductors, such as gallium arsenide, are used as the substrate 1, different, well known preferential etches can be employed to form similar etch pits. Depending upon the substrate material and etchant used, the etch pits may not be pyramidal.

Figure 2C:
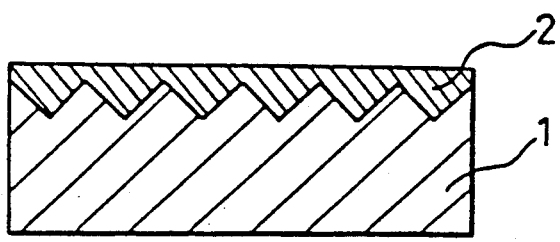

After the formation of the plurality of recesses which, as illustrated in FIG. 2(b), intersect each other at the surface of the substrate 1, an electrically insulating film 2 is deposited on the substrate, filling the recesses, as shown in FIG. 2(c). That electrically insulating film is preferably silicon dioxide, particularly when the substrate is silicon. In addition, silicon nitride and SiON may be deposited as the electrically insulating material 2.

In order to gain electrical access to the substrate 1, a portion of the insulating material 2 must be removed. Preferably, in this embodiment, the film is removed by abrasion, i.e., mechanical polishing, although chemical etching can be employed if the etched surface remains generally planar. The polishing is continued until the substrate 1 is exposed at each of a plurality of mutually isolated locations confined by the insulating material 2. These mutually isolated, small area exposures of the substrate are clearly shown in FIG. 3(b) which is a plan view of the structure shown in side view in FIG. 2(d). This processing step exposes the first surface 14 of the substrate.

After the exposure of the substrate 1 at the isolated locations on the first surface 14, a p-type semiconductor film 3, preferably silicon when the substrate is silicon, is deposited on that surface 14. Typically, the film 3 is 0.1 to 0.5 micron in thickness. When the substrate 1 is monocrystalline, semiconductor film 3 can be grown as a crystalline layer using the exposed portions of the substrate 1 as nucleation sites in accordance with known techniques. Conventional chemical vapor deposition and liquid phase epitaxy processes are employed to deposit film 3.

Finally, the solar cell structure is completed by the deposition of the electrically conducting, transparent anti-reflection film 4 on p-type film 3 followed by the formation of electrodes 5 in electrical contact with film 3. Electrode 6 is deposited on the rear surface, i.e., the second surface 15, of substrate 1. These electrodes 5 and 6 are both preferably layers of titanium and silver when the substrate 1 and film 3 are silicon.

An important feature of the invention illustrated by the steps of FIGS. 2(a)-2(f) is the absence of any photolithographic steps. Thus, the novel structure can be made simply.

Returning to FIG. 1(a), incident light is absorbed in film 3 and produces hole-electron pairs. The charge carriers that are created in the vicinity of one of the plurality of rectifying junctions formed between the substrate 1 and the film 3 drift under the influence of the electric field associated with the depletion region of that junction to that junction and are collected in the solar cell. That charge carrier collection produces an open circuit voltage between electrodes 5 and 6. Since the areas of each of the rectifying junctions formed where the film 3 is in direct contact with the substrate 1 are relatively small, the enhanced open circuit voltage achieved in the prior art point contact solar cell is also achieved in the solar cell structure according to the invention. In addition, as further discussed below, internal reflections at the interfaces of the substrate 1 and insulating material 2, i.e., at the walls of recesses 16, of light that is not initially absorbed increases the amount of the incident light that is ultimately absorbed and thereby the efficiency of the solar cell. The reflections occur because the dielectric constants of the semiconductor material and the electrically insulating material 2 are different, causing incident light that enters the electrically insulating material in one of the recesses 16 to be reflected from the interface of that material and the semiconductor substrate and to re-enter film 3 where light absorption may occur.

Various modifications of the specific embodiment of the invention described can be made. It is important that rectifying junctions be formed between substrate 1 and film 3 where they are in direct contact, but the respective conductivity types of the substrate and film are not important. The substrate 1 need not be a semiconductor wafer and may be a film of sufficient thickness to accommodate the recesses 16. While recesses 16 have been described as formed by preferential chemical etching, those recesses can be mechanically formed by scribing in orthogonal, intersecting, or non-intersecting directions, as further described below.

The rectifying junctions between film 3 and substrate 1 where they are in contact need not be pn junctions. Film 3 may be a relatively thin metal film, i.e., so thin that it does not block significant amounts of incident light, forming a plurality of Schottky barriers with the substrate 1. For example, when substrate 1 is silicon, Schottky barriers can be formed with films 3 of platinum, aluminum, or gold. As is well known, compound semiconductors, such as gallium arsenide, form Schottky barriers with a large number of metals that may be employed as film 3. Film 3 may comprise two layers, a thin metal film and an electrically insulating film, in direct contact with the metal film and the exposed locations of the substrate to form an MIS structure. When the substrate is silicon, the insulating material may be a thin layer of silicon dioxide grown or deposited on the front surface 14 before the deposition of the metal film and the electrically conducting, transparent anti-reflection layer 4. Alternatively, film 3 may be a transparent semiconductor, such as tin oxide, indium tin oxide, tantalum pentoxide, and similar known electrically conductive transparent oxides with semiconducting properties.

Another embodiment of a solar cell according to the invention is shown in a cross-sectional view in FIG. 4. The embodiment of FIG. 4 is similar to that of FIG. 1(a) except that p-type film 3 is replace by p-type regions disposed in n-type substrate 1 at each of the locations where the substrate is exposed at the first surface 14. These regions form pn junctions where carrier collection can occur.

The solar cell structure of FIG. 4 is made by a process that includes the initial steps illustrated in FIGS. 2(a)-2(d). Thereafter, the p-type regions are formed in the substrate 1 after the step illustrated in FIG. 2(d) by the diffusion of a p-type dopant impurity into the substrate at the exposed regions of the substrate separated by the electrically insulating material 2 in the recesses 16. After that diffusion step and with the omission of the step illustrated in FIG. 2(e), the final steps illustrated in FIG. 2(f) are carried out to complete the solar cell structure of FIG. 4. In this embodiment, anti-reflection film 4 is preferably an electrically conducting, transparent film, such as indium tin oxide, tin oxide, tantalum pentoxide, or cadmium stannate. Like the manufacturing process for the solar cell of FIG. 1(a), the processing to produce the structure of FIG. 4 includes no photolithographic steps, simplifying the fabrication of the solar cell.

Figure 5A:
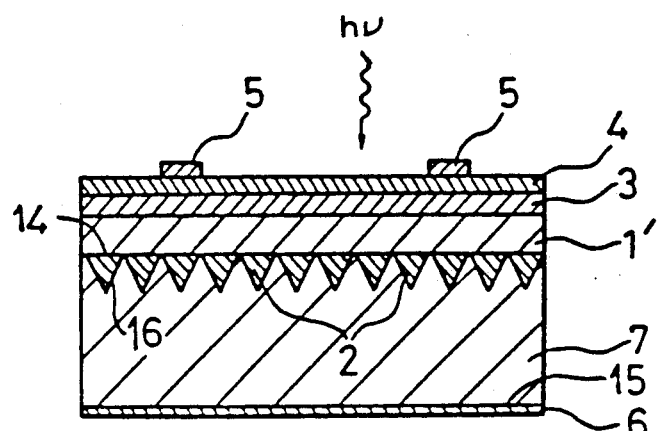
FIGS. 5(a) and 5(b) are sectional side views of a solar cell in accordance with yet another embodiment of the invention.
Figure 5B:
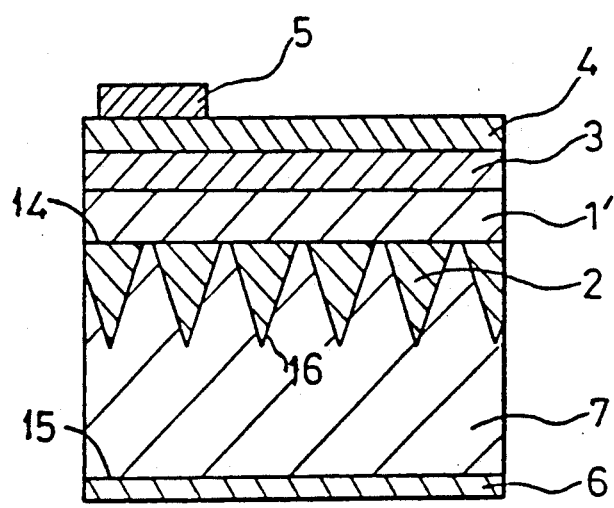

Still another embodiment of a solar cell according to the invention is illustrated in the sectional side view of FIG. 5(a). FIG. 5(b) shows an enlarged view of a portion of the solar cell of FIG. 5(a). In this structure, an electrically conductive substrate 7, which may be a relatively low quality grade of silicon, includes, at a first surface 14, a plurality of recesses 16 filled with an electrically insulating material 2. As in the structure of FIG. 1(a), the substrate is exposed at a plurality of mutually isolated regions on the first surface 14 between the recesses 16 that are filled with the electrically insulating material 2. An n-type semiconductor film 1', for example, silicon, is disposed on that first surface 14 in electrical contact with substrate 7 at each of the locations where that substrate is exposed. A p-type film 3, preferably silicon when film 1' is silicon, is disposed on film 1', forming a relatively large area pn junction. An electrically conducting, transparent anti-reflection film 4 is disposed on the p-type silicon film 3. Electrodes 5 and 6 are in electrical contact with film 3 and the second surface 15 of the substrate 7, respectively.

Steps for manufacturing the solar cell according to this embodiment are illustrated in FIG. 6(a)–6(g). A particular advantage of this embodiment of the invention is the use of a low cost substrate 7, such as a metallurgical or solar grade silicon which may be polycrystalline. The substrate may be, for example, 4 to 20 millimeters in thickness. Since the substrate is unlikely to be single crystalline in this embodiment, crystallographic preferential etching is impossible and the recesses 16 may be formed by scribing. The recesses can also be formed by chemical etching provided an appropriate mask is applied. The etching of a low grade or polycrystalline substrate is essentially isotropic. However, the photolithographic step is preferably avoided. Alternatively, the recesses may be formed when the substrate is cast from a melt or sintered from a powder by applying a metal mold under pressure to form the recesses as the cast liquid or sintered powder solidifies and cools. Molded recesses may have the inverted pyramidal shape illustrated in FIG. 3(a). Scribed recesses may have a lattice pattern or be the plurality of parallel, elongated recesses illustrated in FIG. 7(a) which is a plan view of the structure shown in a side view in FIG. 6(b). In any event, mutually isolated areas of the substrate 7 are exposed at the surface 14.

Figure 2D:
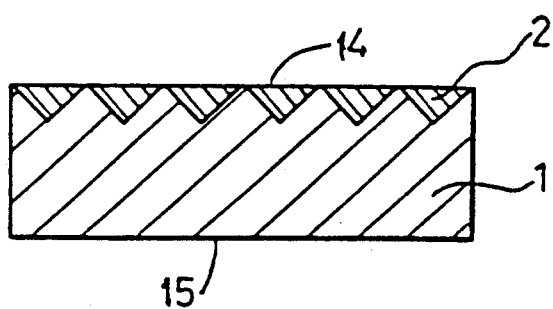
Figure 2E:
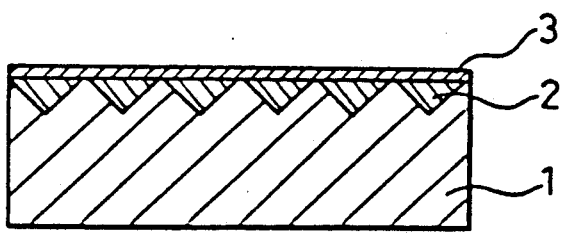
Figure 2F:
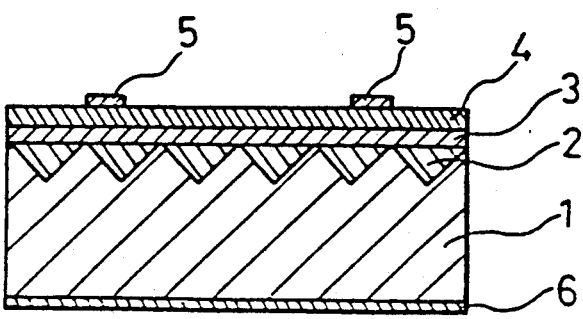
Figure 6F:
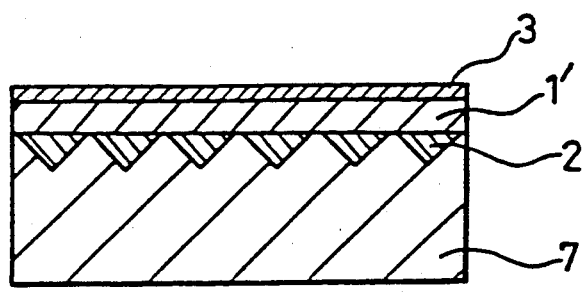
FIGS. 6(a)–6(g) are sectional side views illustrating steps in manufacturing a solar cell according to an embodiment of the invention.
Figure 6G:
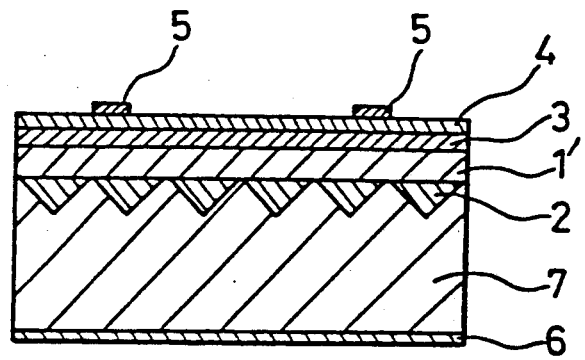
Figure 7A:
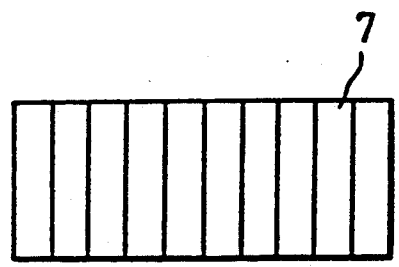
FIGS. 7(a) and 7(b) are plan views corresponding to the side views of FIGS. 6(b) and 6(d).
Figure 7B:
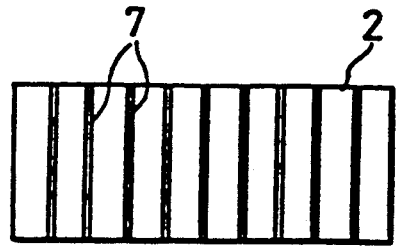
Figure 6A:
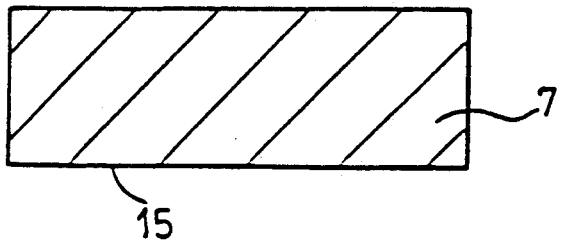
Figure 6B:
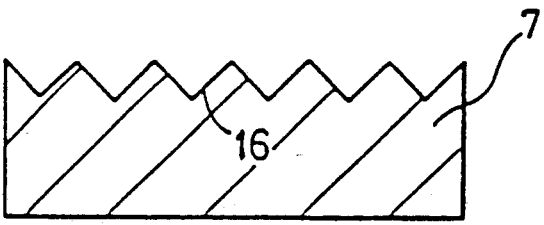
Figure 6C:
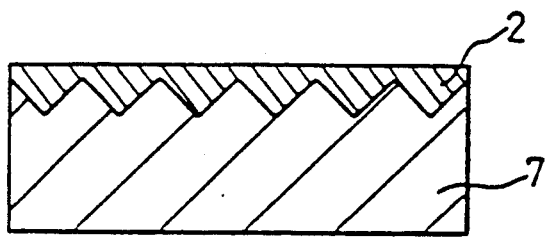
Figure 6D:
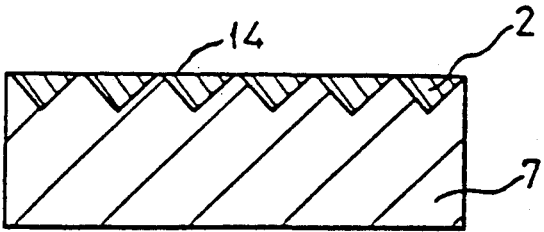

In FIGS. 6(c) and 6(d), the same steps already described with respect to FIGS. 2(c) and 2(d) are carried out for a substrate 7 with a plurality of generally parallel elongated recesses. The result, as shown in the plan view of FIG. 7(b), corresponding to the side view of FIG. 6(d), is the exposure of the substrate in a plurality of parallel, mutually isolated stripes rather than the point-type exposure achieved in the embodiment illustrated in FIG. 3(b).

Figure 6E:
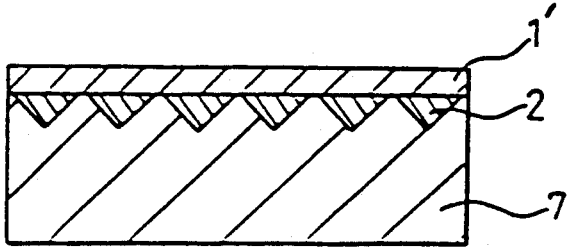

As illustrated in FIGS. 6(e) and 6(f), oppositely doped semiconductor films 1' and 3 are successively grown on the first surface 14 of substrate 7. Alternatively, the p-type film 3, which preferably is relatively thin, may be formed by diffusing a p-type dopant impurity into film 1'. Typically, film 1' may have a thickness of approximately 50 microns whereas film 3 is preferably 0.1 to 0.5 micron thick. The structure is completed, as illustrated in FIG. 6(g), by the deposition of the electrically conducting, transparent anti-reflection film 4 and the electrodes 5 and 6 as described above for other embodiments of the invention.

Figure 8:
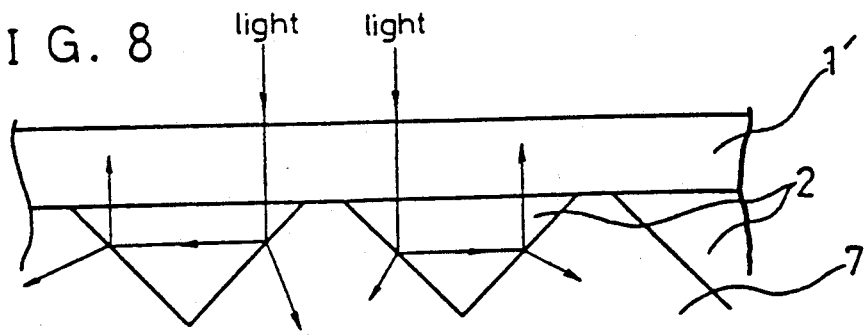
FIG. 8 is a schematic side view of a portion of a solar cell in accordance with the invention illustrating light reflection within the cell.

In this embodiment of the invention, the substrate 7 functions as an electrical contact rather than providing part of the rectifying junction. As illustrated in FIG. 8, the interfaces of the substrate 7 and the electrically insulating material 2 cause internal light reflections. Thus, light that has passed through films 3 and 1' without being absorbed, i.e., without generating charge carriers, is reflected at those interfaces and some of the unabsorbed light again enters those films for possible absorption. These reflections and multiple passages through films 3 and 1' increase the probability that incident light will be absorbed, generate charge carriers, and be collected increasing the efficiency of the solar cell.

In the embodiment of the invention shown in FIG. 5(a), the small proportion of the first surface 14 at which substrate 7 and film 1' are in contact reduces the probability that impurities will diffuse from a relatively low grade substrate 7 into film 1'. Therefore, in this embodiment, relatively low cost substrate material may be employed without danger that the quality of the large area rectifying junction between films 1' and 3 will be spoiled by the substrate.

As in the modified structure of FIG. 1(a), the structure of FIG. 5(a) can be altered by forming a Schottky barrier rather than a rectifying junction. In that structure, film 3 is a thin metal film that does not block significant amounts of incident light but forms a Schottky barrier with film 1'. In addition, an MIS structure is achieved when film 3 comprises a thin, electrically insulating layer, such as silicon dioxide, silicon nitride, or SiON, and a metal film, thin enough so that a significant amount of incident light is not blocked.

The foregoing discussion has been particularly directed to solar cells employing silicon. However, the invention is not limited to solar cells employing that material. Similar structures can be made employing gallium arsenide, indium phosphide, cadmium sulfide in combination with cadmium telluride, and indium gallium arsenide phosphide in combination with gallium arsenide. As is known in the art, cadmium sulfide/cadmium telluride cells can be formed by screen printing, a process that can be applied here when film 3 is one of these cadmium compounds.

Figure 9A:
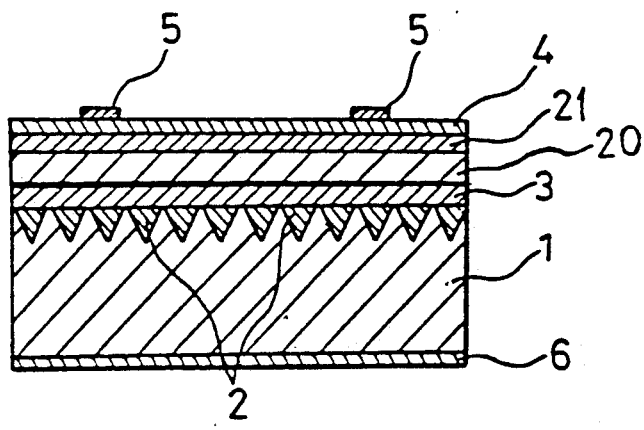
FIGS. 9(a) and 9(b) are sectional side views of still other embodiments of solar cells according to the invention.
Figure 9B:
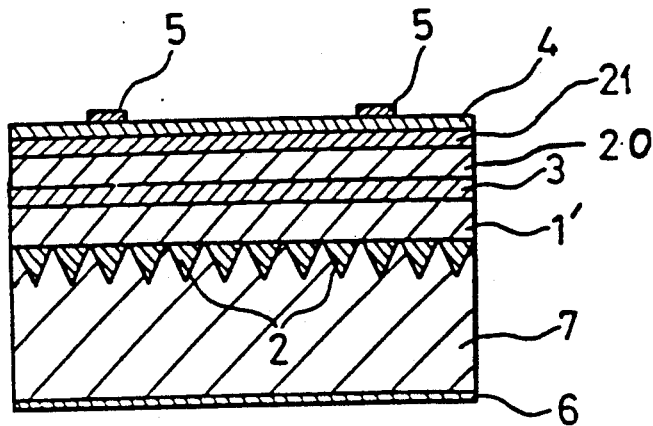
Figure 10A:
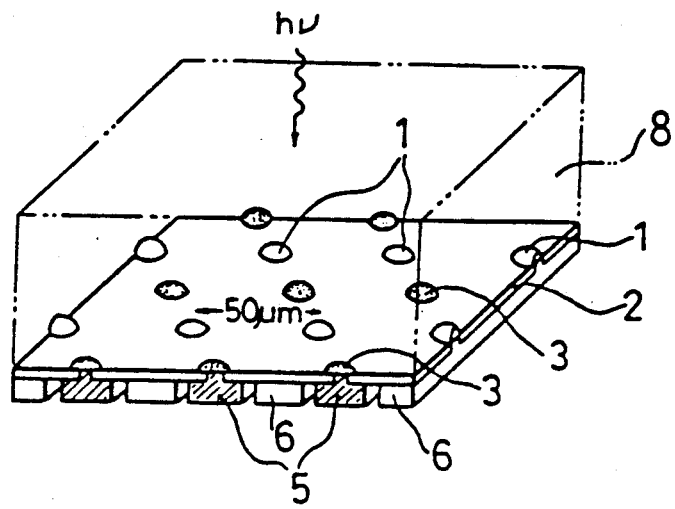
Figure 11A:
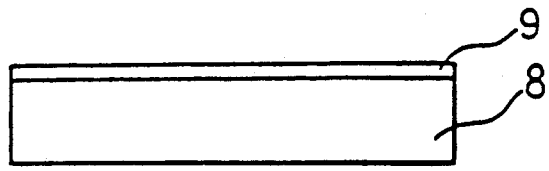
FIGS. 11(a)–11(l) illustrate steps in manufacturing the prior art point contact solar cell of FIG. 10(a).
Figure 11B:
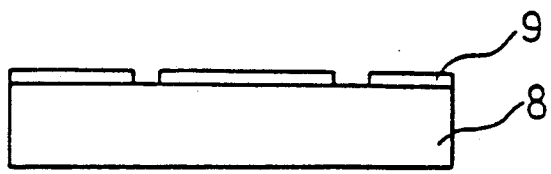
Figure 11C:
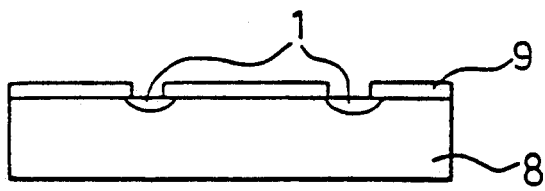
Figure 11D:
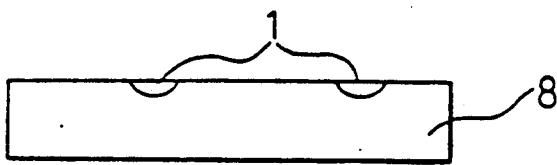
Figure 11E:
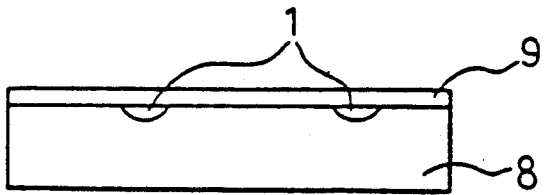
Figure 11F:
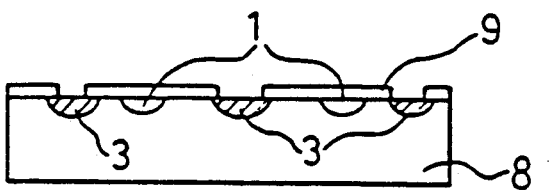
Figure 11G:
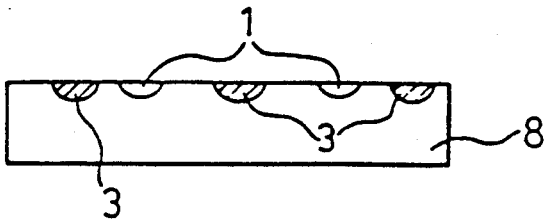
Figure 11H:
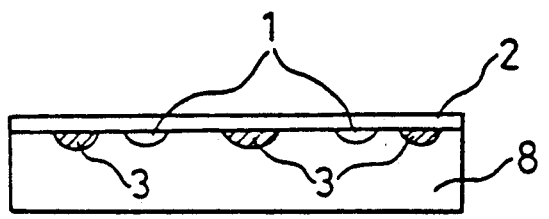
Figure 11I:
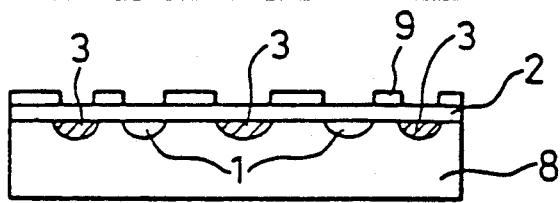
Figure 11J:
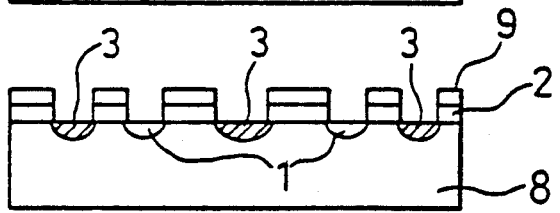
Figure 11K:
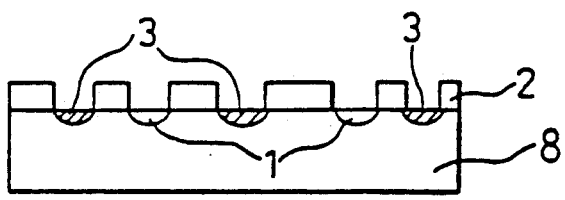
Figure 11L:
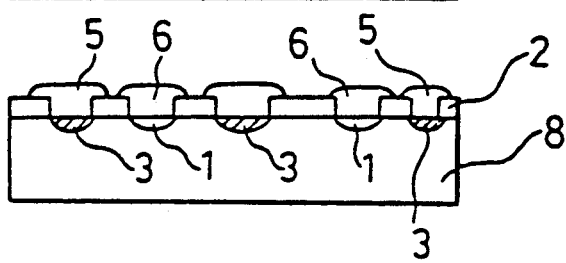

Each of the solar cell embodiments described includes one or more rectifying junctions. Where a plurality of rectifying junctions are provided, the junctions are all effectively connected in parallel. The solar cell can be provided with a second, series connected junction in a tandem, i.e., two cell, structure. Examples of embodiments of tandem cell structures are shown in FIGS. 9(a) and 9(b). The structure shown in sectional side view in FIG. 9(a) corresponds to the structure of FIG. 1(a) with an additional cell including films 20 and 21 disposed between film 3 and electrically conducting, transparent anti-reflection film 4. The embodiment shown in FIG. 9(b) corresponds to the structure shown in FIG. 5(a) but with the addition of a second cell including films 20 and 21. As is known in the solar cell art, films 20 and 21 are semiconductor materials having larger energy band gaps than the semiconductor materials forming the other, deeper junction in the cell. Relatively high energy incident light is absorbed in the cell including films 20 and 21 and lower energy light passes through that cell, without being absorbed, to reach the lower cell including films 1 or 1' and 3. The smaller energy band gap material in the deeper cell then absorbs the lower energy light. For example, films 20 and 21 may be amorphous silicon having an energy band gap of about 1.5 eV, which is conveniently formed at low temperatures, if films 3 and 1 or 1' are crystalline silicon with an energy band gap of about 1.1 eV. Conventionally, amorphous silicon films are formed in a glow discharge plasma and may be doped p-type and n-type to form rectifying junctions.

While certain films in the various embodiments of solar cells, such as layers 3 and 1', have been described as monocrystalline or polycrystalline semiconductor materials, one or both of those layers can be amorphous or microcrystalline in structure without departing from the spirit and scope of the disclosed invention. The present disclosure is thus not limited to particular crystalline states or methods of preparation of the films. Films 3 and 1' may be prepared by liquid phase epitaxy, molecular beam epitaxy, and chemical vapor deposition, including glow discharge, and auxiliary processes such as thermal laser annealing, to produce a desired material and crystallinity for particular applications.

I claim:

1. A solar cell comprising:
   a semiconductor substrate of a first conductivity type having opposed first and second surfaces and including a plurality of recesses disposed in the substrate at the first surface leaving a plurality of mutually isolated area of the substrate exposed at the first surface;
   an electrically insulating material filling the recesses;
   a first semiconductor film of a second conductivity type, opposite from the first conductivity type, disposed on the substrate and the electrically insulating material at the first surface and forming a plurality of mutually isolated rectifying junctions with the substrate;
   second and third semiconductor films of opposite conductivity types forming a rectifying junction and disposed on the first semiconductor film; and
   a first electrode in electrical contact with the third semiconductor film at a light incident surface of the solar cell and a second electrode disposed on the second surface of the substrate in electrical contact with the substrate.

2. The solar cell of claim 1 including an electrically conducting, transparent anti-reflection film disposed on the third semiconductor film.

3. The solar cell of claim 2 wherein the anti-reflection film is chosen from the group consisting of indium tin oxide, tin oxide, and tantalum pentoxide.

4. The solar cell of claim 1 wherein the electrically insulating material is chosen from the group consisting of silicon nitride, silicon dioxide, and SiON.

5. The solar cell of claim 1 wherein combinations of the semiconductor substrate and first semiconductor layer are chosen from the groups consisting of silicon and silicon, gallium arsenide and gallium arsenide, indium phosphide and indium phosphide, cadmium sulfide and cadmium telluride, and indium gallium arsenide phosphide and gallium arsenide.

6. A solar cell comprising:
   a semiconductor substrate of a first conductivity type having opposed first and second surfaces and including a plurality of recesses disposed in the substrate at the first surface, leaving a plurality of mutually isolated areas of the substrate exposed at the first surface, the substrate including at the first surface mutually isolated, spaced apart regions of a second conductivity type, opposite from the first conductivity type;
   an electrically insulating material filling the recesses;
   an electrically conducting, transparent, anti-reflection film on the first surface of the substrate and on the electrically insulating material in electrical contact with the second conductivity type regions; and
   a first electrode in electrical contact with the electrically conducting, transparent, anti-reflection transparent film at a light incident surface of the solar cell and a second electrode disposed on the second surface of the substrate in electrical contact with the substrate.

7. The solar cell of claim 6 wherein the electrically conducting, transparent, anti-reflection transparent film is chosen from the group consisting of indium tin oxide, tin oxide, and tantalum pentoxide.

8. A solar cell comprising:
   an electrically conducting semiconductor substrate having opposed first and second surfaces and including a plurality of recesses disposed in the substrate at the first surface, leaving a plurality of mutually isolated areas of the substrate exposed at the first surface;
   an electrically insulating material filling the recesses;
   a first semiconductor film of a first conductivity type disposed on the electrically insulating material and the semiconductor substrate at the first surface;
   a second semiconductor film of a second conductivity type, opposite from the first conductivity type, disposed on the first semiconductor film forming a rectifying junction with the first semiconductor film; and
   a first electrode in electrical contact with the second semiconductor film at a light incident surface of the solar cell and a second electrode disposed on the second surface of the substrate in electrical contact with the substrate.

9. The solar cell of claim 8 including an electrically conducting, transparent, anti-reflection film disposed on the second semiconductor film.

10. The solar cell of claim 9 wherein the electrically conducting, transparent, anti-reflection film is chosen from the group consisting of indium tin oxide, tin oxide, and tantalum pentoxide.

11. The solar cell of claim 8 wherein the electrically insulating material is chosen from the group consisting of silicon nitride, silicon dioxide, and SiON.

12. The solar cell of claim 8 including third and fourth semiconductor layers of opposite conductivity types forming a rectifying junction and disposed on the first semiconductor film.

13. A solar cell comprising:
   an electrically conducting semiconductor substrate having opposed first and second surfaces and including a plurality of recesses disposed in the substrate at the first surface, leaving a plurality of mutually isolated areas of the substrate exposed at the first surface;
   an electrically insulating material filling the recesses;
   a first semiconductor film disposed on the electrically insulating material and the semiconductor substrate at the first surface;
   a relatively thin metal film disposed on the first semiconductor film; and a first electrode in electrical contact with the thin metal film at a light incident surface of the solar cell and a second electrode disposed on the second surface of the substrate in electrical contact with the substrate.

14. The solar cell of claim 13 including an electrically insulating layer disposed between the first surface and the thin metal film.

15. A method of making a solar cell, comprising:
forming a plurality of recesses in a surface of a semiconductor substrate of a first conductivity type;
depositing an electrically insulating material on the substrate and in the recesses;
removing a portion of the electrically insulating material to expose a first surface of the substrate at a plurality of mutually isolated locations;
depositing a first semiconductor film of a second conductivity type, opposite from the first conductivity type, on the electrically insulating material and the first surface of the substrate to form a plurality of rectifying junctions between the first semiconductor film and the substrate; and
depositing first and second electrodes in electrical contact with the first semiconductor film and substrate, respectively.

16. The method of claim 15 including forming the recesses by chemically etching the substrate.

17. The method of claim 15 including depositing one of silicon nitride, silicon dioxide, and SiON as the electrically insulating material.

18. The method of claim 15 including depositing an electrically conducting, transparent, anti-reflection film on the first semiconductor film.

19. The method of claim 15 including removing a portion of the electrically insulating material to expose the first surface of the substrate by mechanical polishing.

20. A method of making a solar cell, comprising:
forming a plurality of recesses in a surface of a semiconductor substrate of a first conductivity type;
depositing an electrically insulating material on the substrate and in the recesses;
removing a portion of the electrically insulating material to expose a first surface of the substrate at a plurality of mutually isolated locations;
depositing a thin metal film on the electrically insulating material and the first surface of the substrate to form a plurality of rectifying junctions with the substrate; and
depositing first and second electrodes in electrical contact with the thin metal film and substrate, respectively.

21. The method of claim 20 including, after removing a portion of the electrically insulating material, depositing an electrically insulating film on the first surface before depositing the thin metal film.

22. A method of making a solar cell, comprising:
forming a plurality of recesses in a surface of a semiconductor substrate of a first conductivity type;
depositing an electrically insulating material on the substrate and in the recesses;
removing a portion of the electrically insulating material to expose a first surface of the substrate at a plurality of mutually isolated locations;
diffusing a dopant impurity producing the second conductivity type into the first surface of the semiconductor substrate to form mutually isolated pn junctions at respective mutually isolated locations on the first surface of the substrate;
depositing an electrically conducting, transparent, anti-reflection film on the electrically insulating material and the first surface of the substrate; and
depositing first and second electrodes in electrical contact with the electrically conducting, transparent, anti-reflection film and substrate, respectively.

23. A method of making a solar cell, comprising:
forming a plurality of recesses in a surface of an electrically conductive semiconductor substrate;
depositing an electrically insulating material on the substrate and in the recesses;
removing a portion of the electrically insulating material to expose a first surface of the substrate at a plurality of mutually isolated locations;
depositing a first semiconductor film of a first conductivity type on the electrically insulating material and the first surface of the substrate in electrical contact with the substrate at the plurality of mutually isolated locations on the substrate;
depositing a second semiconductor film of a second conductivity type, opposite the first conductivity type, on the first semiconductor film to form a rectifying junction with the first semiconductor film; and
depositing first and second electrodes in electrical contact with the second semiconductor film and substrate, respectively.

24. The method of claim 23 including forming the recesses by mechanically scribing the substrate.

25. The method of claim 23 including depositing an electrically conducting, transparent, anti-reflection film on the second semiconductor film.

26. The method of claim 23 including forming the recesses in the substrate by molding during formation of the substrate.

27. The method of claim 23 including removing a portion of the electrically insulating material by mechanical polishing.

28. A method of making a solar cell, comprising:
forming a plurality of recesses in a surface of an electrically conductive semiconductor substrate;
depositing an electrically insulating material on the substrate and in the recesses;
removing a portion of the electrically insulating material to expose a first surface of the substrate at a plurality of mutually isolated locations;
depositing a first semiconductor film on the electrically insulating material on the first surface of the substrate;
depositing a thin metal film on the first semiconductor film to form a plurality of rectifying junctions with the first semiconductor film; and
depositing first and second electrodes in electrical contact with the thin metal film and substrate, respectively.

29. The method of claim 28 including, after removing a portion of the electrically insulating material, depositing an electrically insulating film on the first semiconductor film before depositing the thin metal film.

* * * * *

UNITED STATES PATENT AND TRADEMARK OFFICE
CERTIFICATE OF CORRECTION

PATENT NO. : 5,100,478
DATED : MARCH 31, 1992
INVENTOR(S) : KIYOSHI KAWABATA

It is certified that error appears in the above-identified patent and that said Letters Patent is hereby corrected as shown below:

Claim 1, column 9, line 29, change "area" to --areas--.

Claim 6, column 10, line 6, after "film" insert --disposed--.

Signed and Sealed this

Sixth Day of July, 1993

Attest:

MICHAEL K. KIRK

*Attesting Officer*     *Acting Commissioner of Patents and Trademarks*